United States Patent
Rajski et al.

(10) Patent No.: US 10,120,029 B2
(45) Date of Patent: Nov. 6, 2018

(54) LOW POWER TESTING BASED ON DYNAMIC GROUPING OF SCAN

(71) Applicant: Mentor Graphics Corporation, Wilsonville, OR (US)

(72) Inventors: Janusz Rajski, West Linn, OR (US); Sylwester Milewski, Nowe Miasto Lubawskie (PL); Grzegorz Mrugalski, Swarzedz (PL); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 250 days.

(21) Appl. No.: 14/710,390

(22) Filed: May 12, 2015

(65) Prior Publication Data

US 2015/0323597 A1    Nov. 12, 2015

Related U.S. Application Data (60) Provisional application No. 61/992,138, filed on May 12, 2014.

(51) Int. Cl.
*G01R 31/3185* (2006.01)
*G01R 31/3177* (2006.01)
*G01R 31/3183* (2006.01)

(52) U.S. Cl.
CPC . *G01R 31/318575* (2013.01); *G01R 31/3177* (2013.01); *G01R 31/318563* (2013.01); *G01R 31/318335* (2013.01); *G01R 31/318385* (2013.01); *G01R 31/318544* (2013.01); *G01R 31/318547* (2013.01); *G01R 31/318555* (2013.01)

(58) Field of Classification Search
CPC ........ G01R 31/3177; G01R 31/318575; G01R 31/318547; G01R 31/318563; G01R 31/318583; G01R 31/318544; G01R 31/318335; G01R 31/318555; G01R 31/318385
See application file for complete search history.

(56) References Cited

U.S. PATENT DOCUMENTS

| | | |
|---|---|---|
| 7,647,540 B2 | 1/2010 | Rajski et al. |
| 7,797,603 B2 | 9/2010 | Rajski et al. |

(Continued)

OTHER PUBLICATIONS

M. Filipek, et al., "Low Power Decompression and PRPG with Constant Value Broadcast", Proc. ATS, pp. 84-89, 2011.

(Continued)

*Primary Examiner* — Cynthia Britt
*Assistant Examiner* — Sazzad Hossain (57) ABSTRACT

Aspects of the disclosed technology relate to low power testing. A low power test circuit comprises a test stimulus source, a controller; and a grouping and selection unit. The grouping and selection unit has inputs coupled to the test stimulus source and the controller and has outputs coupled to a plurality of scan chains. The grouping and selection unit is configured to dynamically group scan chains in the plurality of scan chains into a plurality of scan chain groups and to selectively output either original test pattern values generated by the test stimulus source or a constant value to each scan chain group in the plurality of scan chain groups based on control signals received from the controller.

16 Claims, 6 Drawing Sheets

(56) References Cited

U.S. PATENT DOCUMENTS

| | | | |
|---|---|---|---|
| 7,925,465 B2 | 4/2011 | Lin et al. | |
| 8,015,461 B2 | 9/2011 | Rajski et al. | |
| 8,046,653 B2 | 10/2011 | Rajski et al. | |
| 8,290,738 B2 | 10/2012 | Lin et al. | |
| 8,301,945 B2 | 10/2012 | Rajski et al. | |
| 2004/0237015 A1* | 11/2004 | Abdel-Hafez | G01B 31/31859 714/726 |
| 2005/0055615 A1* | 3/2005 | Agashe | G01R 31/31855 714/727 |
| 2008/0195346 A1* | 8/2008 | Lin | G01B 31/31857 702/119 |
| 2010/0211839 A1* | 8/2010 | Almukhaizim | G06F 11/267 714/729 |
| 2011/0167310 A1* | 7/2011 | Tung | G01B 31/31854 714/731 |
| 2012/0246531 A1* | 9/2012 | Jain | G01B 31/31855 714/729 |
| 2014/0149812 A1* | 5/2014 | Tekumalla | G01R 31/31855 714/727 |
| 2015/0323595 A1* | 11/2015 | Prajapati | G01R 31/3177 714/727 |

OTHER PUBLICATIONS

K. M. Butler, J. Saxena, T. Fryars, G. Hetherington, A. Jain, and J. Lewis, "Minimizing power consumption in scan testing: pattern generation and DFT techniques," Proc. ITC, pp. 355-364, 2004.

R. Sankaralingam, R. R. Oruganti, and N.A. Touba, "Static compaction technique to control scan vector power dissipation," Proc. VTS, pp. 35-40, 2000.

J. Lee and N. A. Touba, "Low power test data compression based on LFSR reseeding," Proc. ICCD, pp. 180-185, 2004.

J. Lee and N. A. Touba, "LFSR-reseeding scheme achieving low-power dissipation during test," IEEE Trans. CAD, vol. 26, pp. 396-401, Feb. 2007.

P. M. Rosinger, B. M. Al-Hashimi, and N. Nicolici, "Low power mixed-mode BIST based on mask pattern generation using dual LFSR re-seeding," Proc. ICCD, pp. 474-479, 2002.

M.-F. Wu, J.-L. Huang, X. Wen, and K. Miyase, "Reducing power supply noise in linear-decompressor-based test data compression environment for at-speed scan testing," Proc. ITC, paper 13.1, 2008.

* cited by examiner

LOW POWER TESTING BASED ON DYNAMIC GROUPING OF SCAN

RELATED APPLICATIONS

This application claims the benefit of U.S. Provisional Patent Application No. 61/992,138, filed on May 12, 2014, and naming Janusz Rajski et al. as inventors, which application is incorporated entirely herein by reference.

FIELD OF THE DISCLOSED TECHNOLOGY

The present disclosed technology is directed to integrated circuit testing technology. Various aspects of the disclosed technology may be particularly useful for low power scan testing.

BACKGROUND OF THE DISCLOSED TECHNOLOGY

Today's integrated circuits are deeply complex in many ways. A dozen or so years ago, a state-of-the-art processor had approximately 40 million transistors, was built on a 180 nm process and relied upon discrete chips to handle its system interfaces. A processor introduced in 2012 had 2.6 billion transistors and was built on a 32 nm process. The very same chip included ten 64-bit cores, L3 cache, graphics processing, DDR3 interfaces, and more. The trend to massive integration is even stronger in the mobile space, where systems on chip (SoC) bring together complex computing, communications and entertainment functions on a single die. Furthermore, clock and reset distribution networks became ubiquitous as they traverse across SoCs feeding all sequential elements while meeting aggressive timing parameters, signal integrity and, in particular, power dissipation specifications. The drive to pack more functions into a small space leads to power delivery and heat flux issues affecting supply integrity and chip packaging. Power issues, however, are not confined to the mission mode. Toggling rates and the resultant power consumption are much higher than a circuit is rated for during structural scan-based testing as the testing goal is to activate as many nodes as possible in the shortest test time. This trend is only expected to continue. The resulting higher junction temperature and increased peak power lead to overheating or supply voltage noise—either of which can cause a device malfunction, and thus yield loss, chip reliability degradation, shorter product lifetime, or device permanent damage.

Over the years, numerous techniques for power reduction of scan testing have been proposed. Test scheduling and vector reordering, partitioning and modifications of scan chains, gating of scan cells, low power test generators, transition blocking and clock gating are all aimed at keeping the power dissipation below a given threshold. A thorough survey of these methods can be found in *Power-Aware Testing and Test Strategies for Low Power Devices*, P. Girard, N. Nicolici, X. Wen (ed.), Springer, New York 2010, which is incorporated herein by reference. Similar techniques have also been proposed for a variety of BIST applications.

The advent of power-aware ATPG (automatic test pattern generation) has added a new dimension to low power testing. Solutions in this group tailor test patterns to the requirements of test application with reduced switching activity. Instead of random fill, unspecified positions of deterministic test vectors assume values minimizing the number of transitions during scan shifting. For example, don't-care bits may assume a constant value or be replicated by using the most recent care bit for all unspecified positions until the next specified bit whose value is used for the following (adjacent) positions.

Test data compression or test compression also faces similar problems related to test power dissipation. In addition to reducing data volume, test time, and test pin counts, several test compression schemes have been able to successfully limit scan toggling. Some of them enhance conventional LFSR (linear feedback shift register) reseeding techniques to reduce the scan-in transition probability. Among them, one method uses two LFSRs to produce tests and corresponding masks. Outputs of the two LFSRs are subsequently merged to decrease the amount of switching. Another method divides test cubes into blocks and uses reseeding to encode blocks with transitions. A constant value fed directly to scan chains replaces other blocks.

The embedded deterministic test (EDT) is a test data compression technology developed by Mentor Graphics Corporation (Wilsonville, Oreg.). Details concerning the EDT technology are provided in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, all of which are hereby incorporated herein by reference. One low power method applicable to the EDT scheme uses available encoding capacity to limit transitions in scan chains. Unlike reseeding-based schemes, this technique freezes a decompressor in certain states. It allows loading scan chains with patterns having low transition counts. Details concerning the method are provided in U.S. Pat. Nos. 7,797,603, 7,647,540, 8,015,461, 8,301,945 and 8,046,653, which are hereby incorporated herein by reference.

In another method applicable to the EDT scheme, low toggling data may be provided to scan chains for a number of shift cycles through a hold register placed in the middle of decompressor. It retains, for a number of cycles, a desired state of the generator, while the generator itself keeps advancing to the next state. The method may employ a power-aware scan controller operating as a linear decompressor. The power-aware scan controller may gate-off scan chains in a per pattern manner based on encoded test data. Details concerning the method are provided in U.S. Pat. Nos. 7,925,465 and 8,290,738, which are hereby incorporated herein by reference.

In still another method, a simple broadcasting of a constant value to predetermined groups of scan chains is employed. Such an approach makes provision for reducing the switching activity to a desired level by using a small amount of control data while test coverage remains intact. Details concerning the method are provided in M. Filipek, et al., "Low Power Decompression and PRPG with Constant Value Broadcast", Proc. ATS, pp. 84-89, 2011 ("Filipek"), which is hereby incorporated herein by reference.

While many low power testing methods have been developed, challenges still remain in achieving power consumption reduction without increasing pattern counts (and thus test time).

BRIEF SUMMARY OF THE DISCLOSED TECHNOLOGY

Aspects of the disclosed technology relate to low power testing. In one aspect, there is an integrated circuit, comprising: a test stimulus source; a controller; and a grouping and selection unit having inputs coupled to the test stimulus source and the controller and having outputs coupled to a plurality of scan chains, wherein the grouping and selection unit is configured to dynamically group scan chains in the plurality of scan chains into a plurality of scan chain groups and to selectively output either original test pattern values generated by the test stimulus source or a constant value to each scan chain group in the plurality of scan chain groups based on control signals received from the controller.

The test stimulus source may be a decompressor configured to receive compressed test pattern values from an external tester or on-chip memory or a pseudorandom test pattern generator. The constant value may be supplied by the controller. The constant value received by one scan chain group in the plurality of scan chain groups is different from the constant value received by another scan chain group in the plurality of scan chain groups.

The controller may be configured to load control data from an external tester, a storage medium in the integrated circuit, a test generator in the integrated circuit, or some combination thereof. The controller may comprise a register storing the control signals.

The grouping and selection unit may comprise a plurality of multiplexers and a plurality of AND/OR gates, wherein the plurality of multiplexers having outputs coupled to some AND/OR gates in the plurality of AND/OR gates.

The grouping and selection unit may be configured to group scan chains in the plurality of scan chains into a plurality of scan chain groups on a cycle-by-cycle basis, a scan-chain-segment-by-scan-chain-segment basis, or a test-pattern-by-test-pattern basis.

In another aspect, there are one or more computer-readable media storing computer-executable instructions for causing a computer to create the above integrated circuit.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Various aspects of the present disclosed technology relate to low power scan testing techniques based on dynamic grouping of scan chains. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Figure 1:
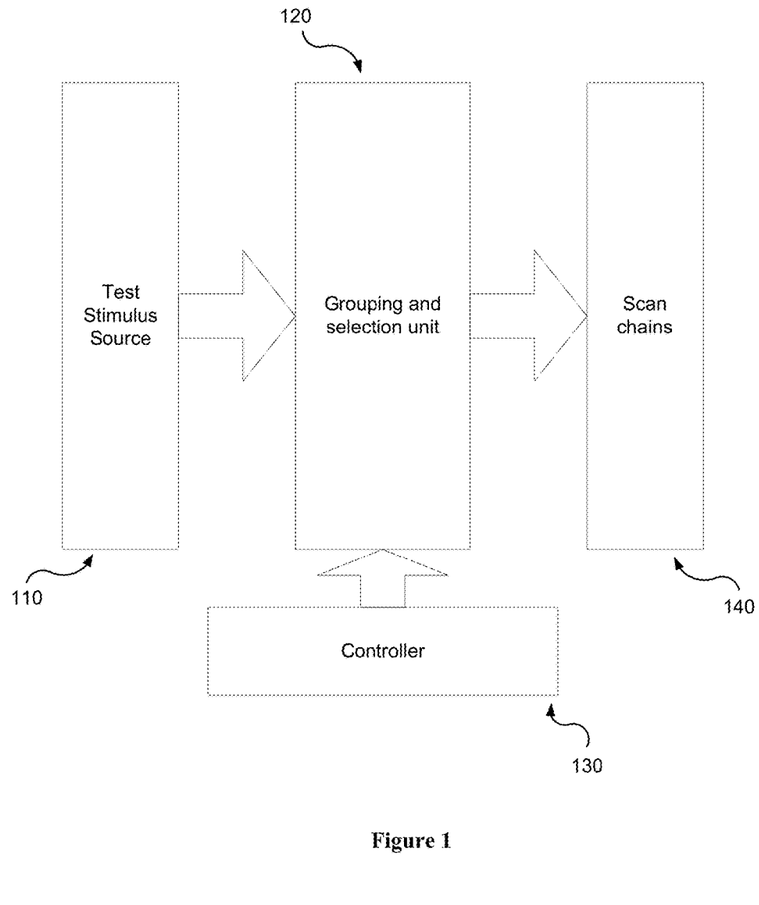
FIG. 1 illustrates an example of a block diagram of low power test circuitry according to various implementations of the disclosed technology.

FIG. 1 illustrates an example of a block diagram of low power test circuitry according to various implementations of the disclosed technology. The low power test circuitry comprises a test stimulus source 110, a grouping and selection unit 120 and a controller 130. The test stimulus source 110 outputs test pattern values to the grouping and selection unit 120. Based on control signals received from the controller 130, the grouping and selection unit 120 dynamically groups scan chains 140 into a plurality of scan chain groups and selectively output either original test pattern values generated by the test stimulus source or a constant value to each scan chain group in the plurality of scan chain groups.

The test stimulus source 110 may be a decompressor or a pseudorandom test pattern generator (PRPG). The decompressor is an important device in a deterministic test with test compression. As more and more transistors are built into a single chip, logic to be tested and thus the volume of scan test data per pin increases dramatically. This causes a significant increase in test time and required tester memory, and thus raises the cost of testing. The test compression techniques take advantage of the small number of significant values in deterministic test patterns to reduce test data volume and test time. In such a test, a test pattern generation and compression tool first generates compressed test patterns. The tester then delivers the compressed test patterns to a decompressor on chip, which decompresses them into test patterns and drives scan chains. Many different test compression methods such as the embedded deterministic test have been developed. Any corresponding decompressor can serve as the test stimulus source 110.

The pseudorandom test pattern generator, as the name suggests, generates "random" test patterns and has been used mainly for built-in self-test (BIST). The pseudorandom test pattern generator may be constructed using a linear feedback shift registers (LFSR), a linear cellular automaton, or a ring generator. The pseudorandom pattern generator unit may further comprise a phase shifter.

Figure 2:
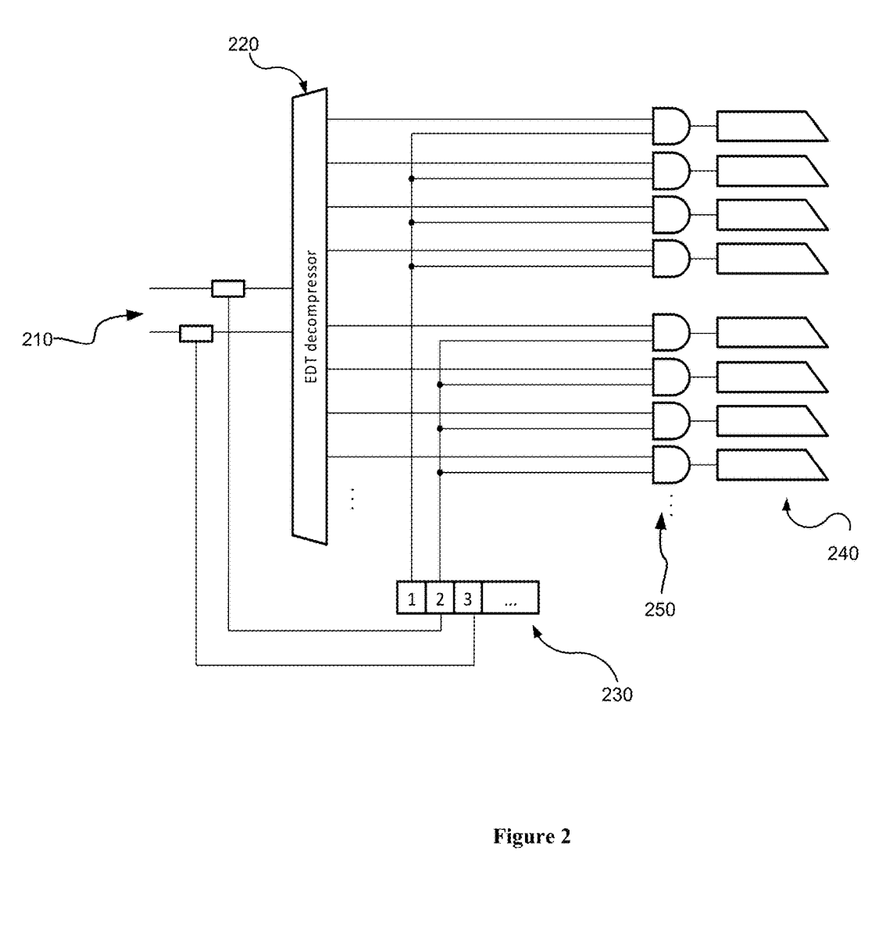
FIG. 2 illustrates an example of a circuit employing the static grouping technique (adapted from Filipek).

One important function of the grouping and selection unit 120 is dynamic grouping. The dynamic grouping approach can overcome some limitations of the static grouping described in Filipek. FIG. 2 illustrates an example of a circuit employing the static grouping technique (adapted from Filipek). Input channels 210 deliver compressed test patterns to a decompressor 220 and additional bits to a control register 230. Scan chains 240 are divided into a plurality of groups (only two groups are shown), of which each is driven through a plurality of AND gates 250 by a bit of the control register 230. For example, a 16-bit register can gate 160 scan chains in such a way that each control bit is shared by a group of 10 scan chains. If a control bit is asserted, then the corresponding scan chains will receive test data from the decompressor 220. Otherwise, the control register enforces the constant value of 0 in the corresponding scan chains. The grouping of scan chains shown in FIG. 2 is static or permanent due to the hardware configuration.

This test method is developed based on the fact that deterministic test patterns have typically only a small fraction of bits specified with their locations confined to a few scan chains. Such scan chains can receive data directly from the decompressor while all remaining chains get a constant value of 0 or 1. It significantly reduces the number of transitions during scan-in shifting without compromising test coverage.

Because the decompressor 220 gains access to all scan chains that belong to the same group when the group is selected, it is beneficial to merge test cubes having care bits confined to scan chains that belong to the group. This way one can circumvent the effects of having too many scan chains receiving data from the decompressor rather than a source of constant values. Such merging, however, is not always possible. As a result, specified bits occur in scan chains hosted by several groups. Too many scan chains driven by the decompressor 220 will likely elevate the toggling rate to an unacceptable degree. In order to alleviate this condition, test cube merging has to counteract by limiting the number of test cubes forming a single test pattern. Unfortunately, this approach may significantly inflate the pattern count unless one is willing to accept compromised fault coverage.

Figure 3:
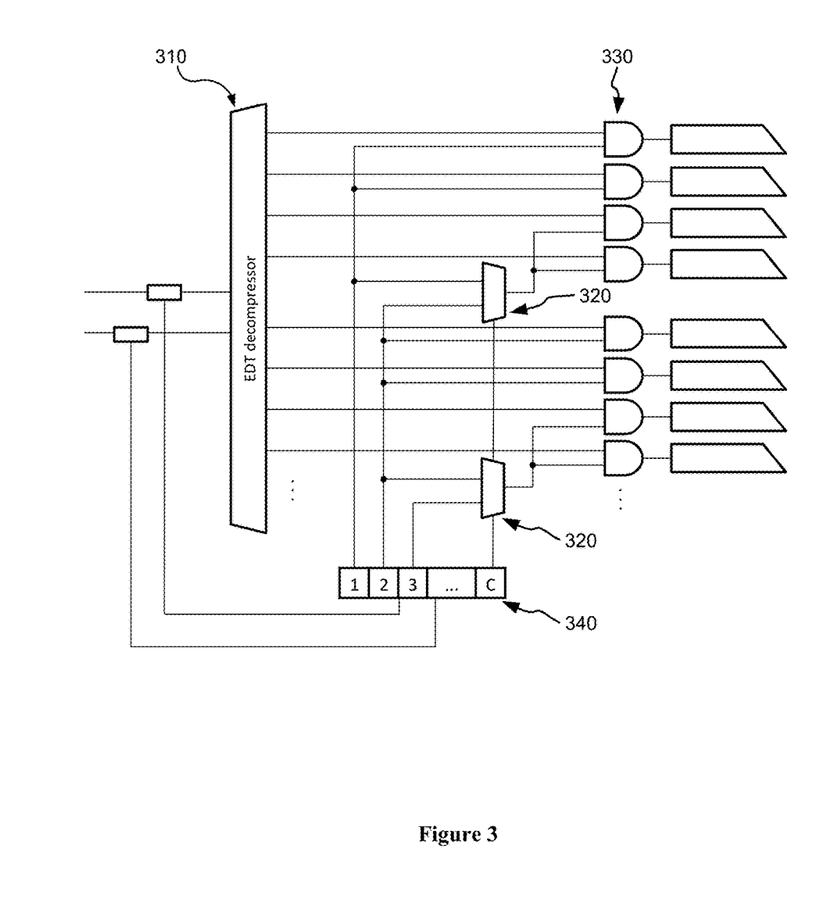
FIG. 3 illustrates an example of a circuit employing the dynamic grouping technique according to various implementations of the disclosed technology.

The dynamic grouping can not only reduce pattern counts, but also has the ability to handle stringent power requirements in a more flexible fashion. FIG. 3 illustrates an example of a circuit employing the dynamic grouping technique according to various implementations of the disclosed technology. In this example, the test stimulus source 110 is an EDT decompressor 310; the grouping and selection unit 120 comprises a plurality of multiplexers 320 and a plurality of AND gates 330; and the controller 130 comprises a register 340.

Figure 4:
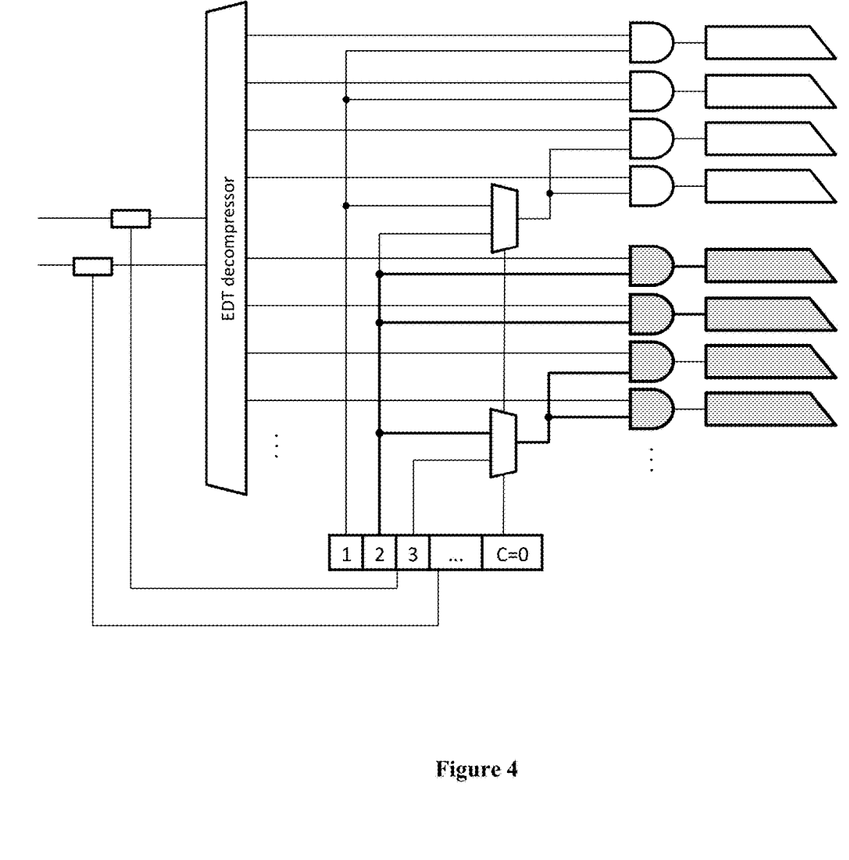
FIG. 4 illustrates one grouping configuration of the circuit shown in FIG. 3.
Figure 5:
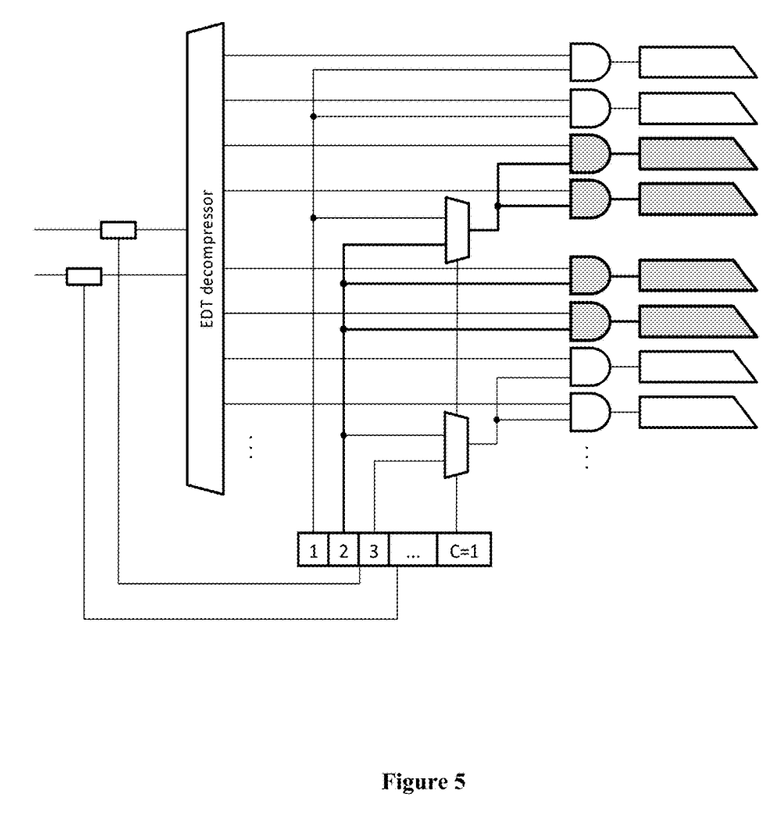
FIG. 5 illustrates another grouping configuration of the circuit shown in FIG. 3.

Compared to the circuit shown in FIG. 2, the additional multiplexers 320 allow scan chains to be grouped differently based on one or more control bits. In the example shown in FIG. 3, 2-to-1 multiplexers are used. These 2-to-1 multiplexers 320 are controlled by a single bit of the register 340. When the control bit is set to 0, the scan chains are grouped similar to FIG. 2, as shown in FIG. 4. When the control bit is asserted (i.e., being set to 1), a different grouping configuration is formed, as shown in FIG. 5.

Increasing the number of control bits to two and using 4-to-1 multiplexers allow four different grouping configurations of scan chains. The number of configurations can be further increased. Other schemes may also be employed for the dynamic grouping.

The encoding (test pattern compression) process associated with the scheme show in FIG. 3 may begin by setting all bits of the control register 340 to 0, and by instantiating an individual solver for each configuration. Next, the process repeatedly picks a test cube, merges it with the current test pattern, assigns the corresponding 1s to the control register, and invokes all the solvers. It is worth noting that activating new scan chains may only be permitted if their quantity remains below a predetermined switching threshold, and a new test cube can be added to a test pattern provided its specified bits are exclusively hosted by scan chains that have already been activated. This process runs as long as the solvers can compress a test pattern. Therefore, once any solver reaches the switching limit, it terminates its operations. When all the solvers become inactive, a test configuration associated with the solver having the greatest test cube count (the largest number of successfully merged test cubes) is linked with the test pattern. Similarly, at some point a solution may not exist anymore. The current test pattern with the corresponding configuration becomes then a new test vector, and the process continues.

Figure 6:
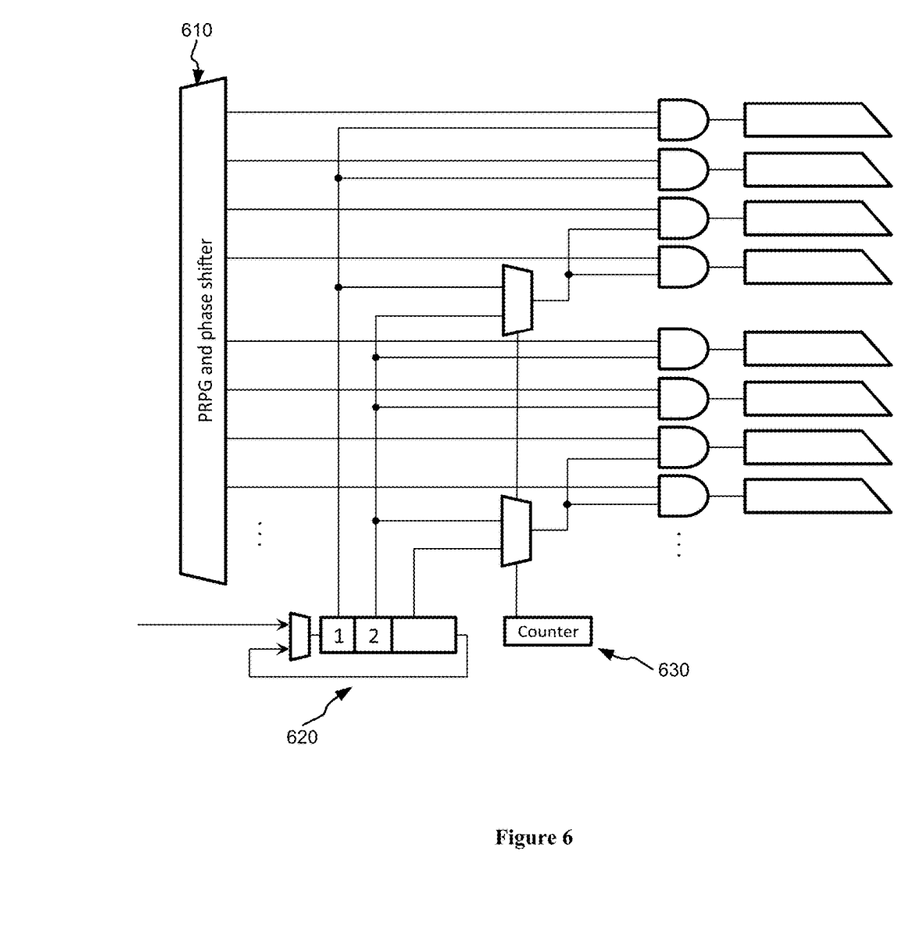
FIG. 6 illustrates an example of a low-power pseudorandom test pattern generator based on dynamic grouping according to various implementations of the disclosed technology.

As noted previously, the test stimulus source 110 may be a pseudorandom test pattern generator (PRPG). FIG. 6 illustrates an example of a low-power pseudorandom test pattern generator based on dynamic grouping. Here, input channels of a pseudorandom test pattern generator (PRPG) 610 are either as assigned a constant non-zero value, or they are completely eliminated (e.g., a ring generator is initialized then with a non-zero seed). A control register 620 assumes the role of a ring counter that shifts cyclically, typically once per pattern, a certain combination of 0s and 1s. The number of 1s determines the level of toggling as only the corresponding groups of scan chains will be active. It is, therefore, a convenient technique to shape the power dissipation profile during self-test.

In some circuits, shutting down large groups of adjacent scan chains may negatively impact test coverage. The dynamic grouping technology may deal with the issue in a two-fold manner. First, an appropriate size of the control register 620 may be selected and loaded with a relevant sequence of 0s and 1s. As a result, clusters of frozen scan chains will be interspersed with groups of active chains, as required. Second, scan chains are periodically regrouped to allow a given control bit to drive different groups of (not necessarily adjacent) scan chains. This may be accomplished by adding a small binary counter 630 whose output controls, in parallel, all multiplexers so that regrouping can be invoked every required number of clock (scan shift) cycles.

The test circuitry implementing the disclosed technology may be inserted into a circuit design using an electronic design automation (EDA) tool. The electronic design automation (EDA) tool contains computer-executable instructions stored in one or more non-transitory computer-readable media. A non-transitory computer-readable medium may be, for example, a magnetic storage device, an optical storage device, a "punched" surface type device, or a solid state storage device.

Conclusion

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims.

What is claimed is:

1. An integrated circuit, comprising:
    a test stimulus source;
    a controller;
    a plurality of scan chains; and
    a grouping and selection unit having inputs coupled to the test stimulus source and the controller and having outputs coupled to the plurality of scan chains, wherein the grouping and selection unit is configured to dynamically group scan chains in the plurality of scan chains into a plurality of scan chain groups on a cycle-by-cycle basis, a scan-chain-segment-by-scan-chain-segment basis, or a test-pattern-by-test-pattern basis based on control signals received from the controller, wherein the plurality of scan chain groups formed at one shift clock cycle differ from the plurality of scan chain groups formed at least at one other shift clock cycle, and to selectively output either original values in a test pattern outputted by the test stimulus source or a constant value to each scan chain group in the plurality of scan chain groups based on the control signals received from the controller, wherein the constant value replaces the original values in the test pattern directed to at least one but not all of the plurality of scan chain groups during at least a set of continuous shift clock cycles while shifting the test pattern into the plurality of scan chain groups.

2. The integrated circuit recited in claim 1, wherein the test stimulus source is a decompressor configured to receive compressed test pattern values from an external tester or on-chip memory.

3. The integrated circuit recited in claim 1, wherein the test stimulus source is a pseudorandom test pattern generator.

4. The integrated circuit recited in claim 1, wherein the grouping and selection unit comprises a plurality of multiplexers and a plurality of AND/OR gates, wherein the plurality of multiplexers having outputs coupled to some AND/OR gates in the plurality of AND/OR gates.

5. The integrated circuit recited in claim 1, wherein the controller comprises a register storing the control signals.

6. The integrated circuit recited in claim 1, wherein the controller is configured to load control data from an external tester, a storage medium in the integrated circuit, a test generator in the integrated circuit, or some combination thereof.

7. The integrated circuit recited in claim 1, wherein the constant value is supplied by the controller.

8. The integrated circuit recited in claim 1, wherein the constant value received by one scan chain group in the plurality of scan chain groups is different from the constant value received by another scan chain group in the plurality of scan chain groups.

9. One or more non-transitory computer-readable media storing computer-executable instructions for causing a computer to perform a method comprising:
inserting circuitry into a circuit design, the circuitry comprising:
a test stimulus source;
a controller;
a plurality of scan chains; and
a grouping and selection unit having inputs coupled to the test stimulus source and the controller and having outputs coupled to the plurality of scan chains, wherein the grouping and selection unit is configured to dynamically group scan chains in the plurality of scan chains into a plurality of scan chain groups on a cycle-by-cycle basis, a scan-chain-segment-by-scan-chain-segment basis, or a test-pattern-by-test-pattern basis based on control signals received from the controller, wherein the plurality of scan chain groups formed at one shift clock cycle differ from the plurality of scan chain groups formed at least at one other shift clock cycle, and to selectively output either original values in a test pattern outputted by the test stimulus source or a constant value to each scan chain group in the plurality of scan chain groups based on the control signals received from the controller, wherein the constant value replaces the original values in the test pattern directed to at least one but not all of the plurality of scan chain groups during at least a set of continuous shift clock cycles while shifting the test pattern into the plurality of scan chain groups.

10. The one or more non-transitory computer-readable media recited in claim 9, wherein the test stimulus source is a decompressor configured to receive compressed test pattern values from an external tester or on-chip memory.

11. The one or more non-transitory computer-readable media recited in claim 9, wherein the test stimulus source is a pseudorandom test pattern generator.

12. The one or more non-transitory computer-readable media recited in claim 9, wherein the grouping and selection unit comprises a plurality of multiplexers and a plurality of AND/OR gates, wherein the plurality of multiplexers having outputs coupled to some AND/OR gates in the plurality of AND/OR gates.

13. The one or more non-transitory computer-readable media recited in claim 9, wherein the controller comprises a register storing the control signals.

14. The one or more non-transitory computer-readable media recited in claim 9, wherein the controller is configured to load control data from an external tester, a storage medium in the integrated circuit, a test generator in the integrated circuit, or some combination thereof.

15. The one or more non-transitory computer-readable media recited in claim 9, wherein the constant value is supplied by the controller.

16. The one or more non-transitory computer-readable media recited in claim 9, wherein the constant value received by one scan chain group in the plurality of scan chain groups is different from the constant value received by another scan chain group in the plurality of scan chain groups.

* * * * *